(12) United States Patent
Bjontegaard et al.

(10) Patent No.: US 8,306,347 B2
(45) Date of Patent: Nov. 6, 2012

(54) VARIABLE LENGTH CODING (VLC) METHOD AND DEVICE

(75) Inventors: Gisle Bjontegaard, Oppegard (NO); Arild Fuldseth, Lysaker (NO)

(73) Assignee: Cisco Technology, Inc., San Jose, CA (US)

( * ) Notice: Subject to any disclaimer, the term of this patent is extended or adjusted under 35 U.S.C. 154(b) by 712 days.

(21) Appl. No.: 12/339,817

(22) Filed: Dec. 19, 2008

(65) Prior Publication Data

US 2009/0161974 A1 Jun. 25, 2009

(30) Foreign Application Priority Data

Dec. 20, 2007 (NO) .................................. 20076589
Jun. 11, 2008 (NO) .................................. 20082612

(51) Int. Cl.
*G06K 9/36* (2006.01)
(52) U.S. Cl. ........................................................ 382/246
(58) Field of Classification Search ........... 382/232–253
See application file for complete search history.

(56) References Cited

U.S. PATENT DOCUMENTS

| | | | | |
|---|---|---|---|---|
| 5,317,413 A * | 5/1994 | Yanagihara | .................... | 386/232 |
| 5,999,111 A | 12/1999 | Park et al. | | |
| 6,020,923 A * | 2/2000 | Hosaka et al. | ........... | 375/240.12 |
| 6,917,651 B1 | 7/2005 | Yoo et al. | | |
| 6,970,938 B2 * | 11/2005 | Sugiyama et al. | ............ | 709/231 |
| 7,095,896 B2 * | 8/2006 | Abe et al. | ...................... | 382/233 |
| 7,697,770 B2 * | 4/2010 | Abe et al. | ...................... | 382/238 |
| 2004/0120404 A1 * | 6/2004 | Sugahara et al. | ........ | 375/240.23 |
| 2006/0110059 A1 | 5/2006 | Lin et al. | | |

FOREIGN PATENT DOCUMENTS

| | | |
|---|---|---|
| JP | 4-280517 | 10/1992 |
| JP | 7-334344 | 12/1995 |

OTHER PUBLICATIONS

Japanese Office Action issued on Feb. 13, 2012, in Japanese Patent Application No. 2010-539342 (with English Translation).
Extended European Search Report issued Jul. 28, 2011, in Patent Application No. 08865415.7.
Byeungwoo Jeon, et al., "Huffman coding of DCT coefficients using dynamic codeword assignment and adaptive codebook selection", Signal Processing: Image Communication, vol. 12, No. 3, XP004122852, Jun. 1998, pp. 253-262.

(Continued)

*Primary Examiner* — Jingge Wu
(74) *Attorney, Agent, or Firm* — Oblon, Spivak, McClelland, Maier & Neustadt, L.L.P.

(57) ABSTRACT

A method for representing video data related to a macroblock of a video image in a coding procedure wherein certain, video data or combinations of video data is represented in predefined events associated with indexed positions in a Variable Length Code (VLC) table including codes assigned to each indexed position, including: determining, with a processor, that a first event among said predefined events occurs during the coding procedure; coding, with the processor, the first event with a code assigned to a position x in the VLC table being associated with the first event, the VLC table being stored in a memory device; determining, with the processor, whether x>0, wherein 0 denotes a position at a top of the VLC table; and rearranging, with the processor, the VLC table by associating a second event currently associated with a position x−1 with the position x, and associating the first event with the position x−1.

6 Claims, 3 Drawing Sheets

OTHER PUBLICATIONS

Yoshi Okada, et al., "Self-Organized Dynamic Huffman Coding without Frequency Counts", Proceedings of the Data Compression Conference, XP002403947, Mar. 28, 1995, p. 473.

Chen Pei-Yin, et al., "A Low-Cost VLC Implementation for MPEG-4", IEEE Transactions on Circuits and Systems II: Express Briefs, vol. 54, No. 6, XP011185552, Jun. 2007, pp. 507-511.

* cited by examiner

VARIABLE LENGTH CODING (VLC) METHOD AND DEVICE

CROSS-REFERENCE TO RELATED APPLICATIONS

The present application claims priority under 35 U.S.C. §119 to Norwegian patent applications 20076589, filed on Dec. 20, 2007, and 20082612, filed on Jun. 10, 2008, the entire contents of both of which are hereby incorporated by reference in their entirety.

TECHNICAL FIELD

Exemplary embodiments of the invention are related to Variable Length Coding (VLC) of video data in video compression systems.

BACKGROUND

Transmission of moving pictures in real-time is employed in several applications like, e.g., video conferencing, net meetings, TV broadcasting and video telephony.

However, representing moving pictures requires bulk information as digital video typically described by representing each pixel in a picture with 8 bits (1 Byte). Such uncompressed video data results in large bit volumes, and can not be transferred over conventional communication networks and transmission lines in real time due to limited bandwidth.

Thus, enabling real time video transmission requires an extrusive use of data compression. Data compression may, however, compromise with picture quality. Therefore, great efforts have been made to develop compression techniques allowing real time transmission of high quality video over bandwidth limited data connections.

In video compression systems, the main goal is to represent the video information with as little capacity as possible. Capacity is defined with bits, either as a constant value or as bits/time unit. In both cases, the main goal is to reduce the number of bits.

Many video compression standards have been developed. Many of those methods are standardized through ISO (the International Standards organization) or ITU (the International Telecommunications Union). In addition, a number of other proprietorial methods have been developed. The main standardization methods are:
ITU: H.261, H.262, H.263, H.264; and
ISO: MPEG1, MPEG2, MPEG4/AVC.

The first step in the coding process according to these standards is to divide the picture into square blocks of pixels, for instance 16×16 or 8×8 pixels. This is done for luminance information as well as for chrominance information.

The prediction process that follows significantly reduces the amount of bits required for each picture in a video sequence to be transferred. It takes advantage of the similarity of parts of the sequence with other parts of the sequence, and produces a prediction for the pixels in the block. This may be based on pixels in an already coded/decoded picture (called inter prediction) or on already coded/decoded pixels in the same picture (intra prediction). The prediction is mainly based on vectors representing movements.

Since the predictor part is known to both the encoder and decoder, only the difference has to be transferred. This difference typically requires much less capacity for its representation. The difference between the pixels to be coded and the predicted pixels is often referred to as a residual.

The residual represented as a block of data (e.g. 4×4 pixels) still contains internal correlation. A well-known method of taking advantage of this is to perform a two dimensional block transform. In H.263, an 8×8 Discrete Cosine Transform (DCT) is used, whereas H.264 uses a N×N (where N can be 4 or 8) integer type transform. This transforms N×N pixels into N×N transform coefficients and they can usually be represented by fewer bits than the pixel representation. A transform of an N×N array of pixels with internal correlation will probability result in a 4×4 block of transform coefficients with much fewer non-zero values than the original 4×4 pixel block.

Direct representation of the transform coefficients is still too costly for many applications. A quantization process is carried out for a further reduction of the data representation. Hence the transform coefficients undergo quantization. A simple version of quantization is to divide parameter values by a number—resulting in a smaller number that may be represented by fewer bits. This is the major tool for controlling the bit production and reconstructed picture quality. It should be mentioned that this quantization process has as a result that the reconstructed video sequence is somewhat different from the uncompressed sequence. This phenomenon is referred to as "lossy coding". This means that the reconstructed pictures typically have lower quality than the original pictures. The outputs from the quantization process are integer numbers—which do not represent the original transform coefficients correctly. These integers together with integers representing the side information are coded in a lossless way and transmitted to the decoder.

Finally, a so-called scanning of the two dimensional transform coefficient data into a one dimensional set of data is performed, and the one dimensional set is further transformed according to en entropy coding scheme. Entropy coding implies lossless representation of the quantized transform coefficients.

The above steps are listed in a natural order for the encoder. The decoder will to some extent perform the operations in the opposite order and do "inverse" operations as inverse transform instead of transform and de-quantization instead of quantization.

Lossless coding is conventionally being used for entropy coding of quantized transform coefficients, and for coding side information like motion vectors, coding mode and Coded Block Pattern (CBP). Typically a set of "events" are defined in an event table. Then a Variable Length Code (VLC) code table is defined and each event is coupled to a code in the VLC table. Below are some examples of event tables to be coded.

Motion vector components are typically horizontal or vertical components. Assuming now that only one such component is considered, and the value is an integer number that may be positive or negative. The most probable value is 0. Then follow ±1, ±2, ±3, etc. with descending probability. A good combination of vector values and code values turn out to be:

| .. | .. |
|---|---|
| −3 | 00110 |
| −2 | 00100 |
| −1 | 010 |
| 0 | 1 |
| 1 | 011 |
| 2 | 00101 |
| 3 | 00111 |

For an optimal solution the most probable event should have the shortest code. More specifically, the code length in bits should be equal to the entropy of the event or: Code_length=−log$_2$(probability_of_event).

Hence the VLC above is optimal if the probabilities of . . . −3, −2, −1, 0, 1, 2, 3 are 1/32, 1/32, 1/8, 1/2 1/8, 1/32, 1/32 etc.

Another kind of side information that typically is coded with VLC tables is CBP. It turns out to be beneficial to signal which of 4 8×8 luminance blocks and 2 collocated 8×8 or chrominance blocks in a macroblock that have nonzero coefficients or not by VLC. Therefore, an event table with the 2$^6$=64 possible events is defined. A corresponding VLC table is defined that matches the probabilities of the 64 events.

The quantized transform coefficients are also coded by lossless VLC. There are many ways of coding the transform coefficients efficiently. This may lead to different event tables—and associated VLCs. Conventionally, the quantized transform coefficients in a block are expressed by the number of nonzero transform coefficients in a block, the position of the last nonzero transform coefficients in a block and the actual size of transform coefficients. Combinations of this information then create events defined in VLC tables. For example, a combined event can be coded indicating both the position of the last nonzero and whether the size of the last coefficient=1 or >1. Other combinations can also be used, but the basics are still to select combinations and corresponding VLC tables minimizing the number of bits required based on the likelihood of events.

This will result in low bit usage as long as the data to be coded fit reasonably well with the underlying statistics. In the opposite case, when very untypical data is to be coded, the use of bits may become too high. In situation where the data to be coded fail to fit with the "normal" statistics, occurrences that are represented by a large number of bits will become more frequent. This may be the situation at rapid and lasting light changes in the environment where the video image is captured. This will harm the quality of the encoded/decoded image as the coding process automatically will adjust the quantization intervals to comply the frequent occurrence of long code words.

SUMMARY

A first exemplary embodiment includes method for representing video data related to a macroblock of a video image in a coding procedure wherein certain, video data or combinations of video data is represented in predefined events associated with indexed positions in a Variable Length Code (VLC) table including codes assigned to each indexed position, including: determining, with a processor, that a first event among said predefined events occurs during the coding procedure; coding, with the processor, the first event with a code assigned to a position x in the VLC table being associated with the first event, the VLC table being stored in a memory device; determining, with the processor, whether x>0, wherein 0 denotes a position at a top of the VLC table; and rearranging, with the processor, the VLC table by associating a second event currently associated with a position x−1 with the position x, and associating the first event with the position x−1.

A second exemplary embodiment includes a method for interpreting codes related to a macroblock of a video image in a decoding procedure wherein the codes are interpreted as predefined events representing decoded video data or combinations of decoded video data associated with indexed positions in a Variable Length Code (VLC) table including codes assigned to each indexed position, including: determining, with a processor, that a code occurs during the decoding procedure; interpreting, with the processor, the code as a first event among said predefined events associated with a position x in the VLC table to which the code is assigned, the VLC table being stored in a memory device; determining, with the processor, whether x>0, wherein 0 denotes a position at a top of the VLC table; and rearranging, with the processor, the VLC table by associating a second event currently associated with a position x−1 with position x, and associating the first event with the position x−1.

Furthermore, exemplary embodiments of the invention include a coding device, a decoding device, and a computer readable storage medium.

It is to be understood that both the foregoing general description of the invention and the following detailed description are exemplary, but are not restrictive, of the invention.

BRIEF DESCRIPTION OF THE DRAWINGS

A more complete appreciation of the inventions and many of the attendant advantages thereof will be readily obtained as the same becomes better understood by reference to the following detailed description when considered in connection with the accompanying drawings. However, the accompanying drawings and their exemplary depictions do not in any way limit the scope of the inventions embraced by this specification. The scope of the inventions embraced by the specification and drawings are defined by the words of the accompanying claims.

DETAILED DESCRIPTION

Exemplary embodiments of the present invention provide lossless coding of event tables with dynamically matching VLC tables. As described above, the most probable event should be assigned the shortest code and the respective events should have increasing code length as the associated probability of occurrence decrease. The exemplary embodiments of the present invention take into account that the probability distribution of the event table may not be stable as we move through different parts of a video sequence. Each time an event has occurred, this event is moved one position up in the event table, i.e. the just occurring event changes position with the event associated with the position just above. However, the codes assigned to each position remain unchanged; it is just the associations of the events with the table positions that are being rearranged.

An event occurring more frequently than the position in the original event table will then gradually be assigned shorter bit codes. Hence, a more bit effective coding will be provided even in occasions of rapidly changing colour or light, or other rarely occurring conditions.

Figure 2:
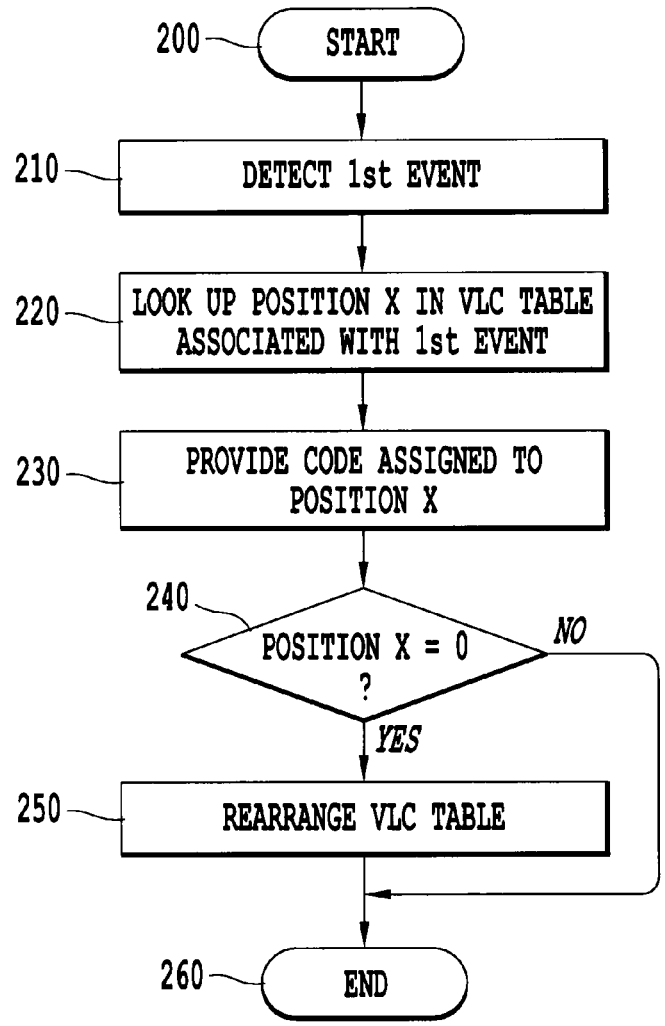
FIG. 2 is a schematic flow chart illustrating principles of a method for representing video data.

FIG. 2 is a schematic flow chart illustrating principles of a method for representing video data.

The illustrated method is a method for representing video data related to a macroblock of a video image in a coding procedure wherein certain video data, or a combination of video data, or combinations of video data, are represented in predefined events associated with indexed positions in a Variable Length Code (VLC) table. The VLC table includes codes assigned to each indexed position.

The method starts at the initiating step 200.

The occurrence of a first event among said predefined events during the coding procedure is detected in the detecting step 210. The subsequent steps are performed provided that the first event is detected in step 210.

Next, in the table lookup step 220, a position x associated with the detected first event is looked up in the VLC table.

Next, in the code providing step 230, a code assigned to the position x in the VLC table is provided.

Next, in the test step 240, it is determined if the position x>0. This is the case if the event is associated with a position different from the position at the top of the VLC table, since the position at the top has index=0.

If x>0, the VLC rearranging step 250 is performed. Otherwise, the method is terminated at step 260.

In the VLC table rearranging step 250, the VLC table is rearranged by
  associating a second event currently associated with a position x−1 with the position x, and
  associating the first event among said predefined events with the position x−1.

The video data used in the method may be one or more of the following:
  Size of quantized transform coefficients,
  number of nonzero quantized transform coefficients in a block,
  position of a last nonzero quantized transform coefficients in a block,
  size of a block,
  coding mode and
  Coded Block Pattern.

Figure 3:
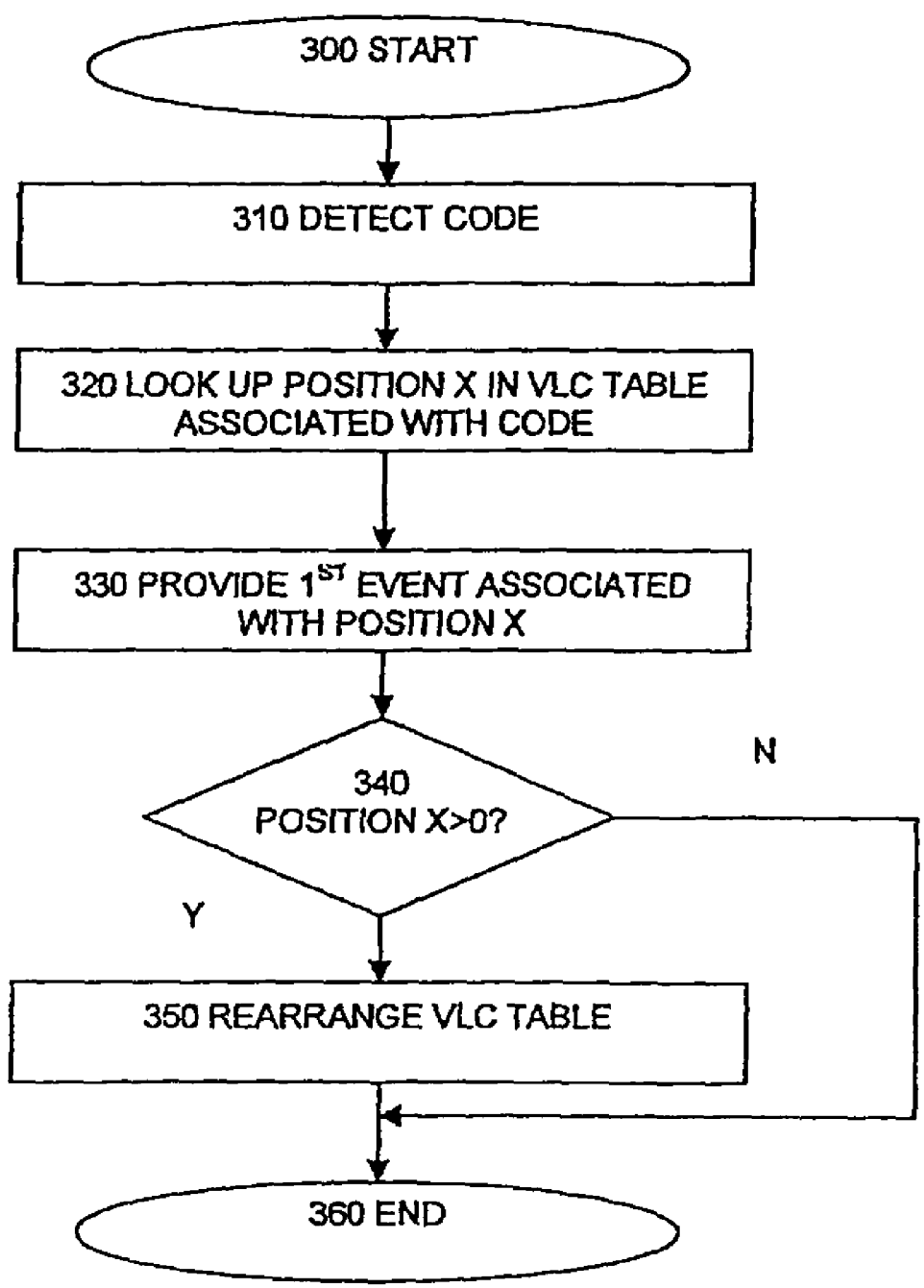
FIG. 3 is a schematic flow chart illustrating principles of a method for interpreting codes related to a macroblock of a video image.

The method is terminated at the terminating step 260. FIG. 3 is a schematic flow chart illustrating principles of a method for processing codes related to a macroblock of a video image.

The illustrated method is a method for interpreting codes related to a macroblock of a video image in a decoding procedure wherein the codes are interpreted as predefined events representing decoded video data or combinations of decoded video data associated with indexed positions in a Variable Length Code (VLC) table including codes assigned to each indexed position.

The method starts at the initiating step 300.

The occurrence of a code during the decoding procedure is detected in the detecting step 310. The subsequent steps are performed provided that the code is detected in step 310.

Then, in the table lookup step 320, a position x associated with the detected code is looked up in the VLC table.

Next, in the event providing step 330, a first event associated with the position x in the VLC table is provided.

Next, in the test step 340, it is determined if the position x>0. This is the case if the detected code is associated with a position different from the position at the top of the VLC table, since the position at the top has index=0. If x>0, the rearranging step 350 is performed. Otherwise, the method is terminated at step 360.

In the VLC table rearranging step 350 the VLC table is rearranged by performing steps of:
  associating a second event currently associated with a position x−1 with position x, and
  associating the first event with the position x−1.

The video data used in the method may be one or more of the following:
  size of quantized transform coefficients,
    number of nonzero quantized transform coefficients in a block,
    position of a last nonzero quantized transform coefficients in a block,
    size of a block,
    coding mode, and
  Coded Block Pattern.

The method is terminated at the terminating step 360.

Figure 4:
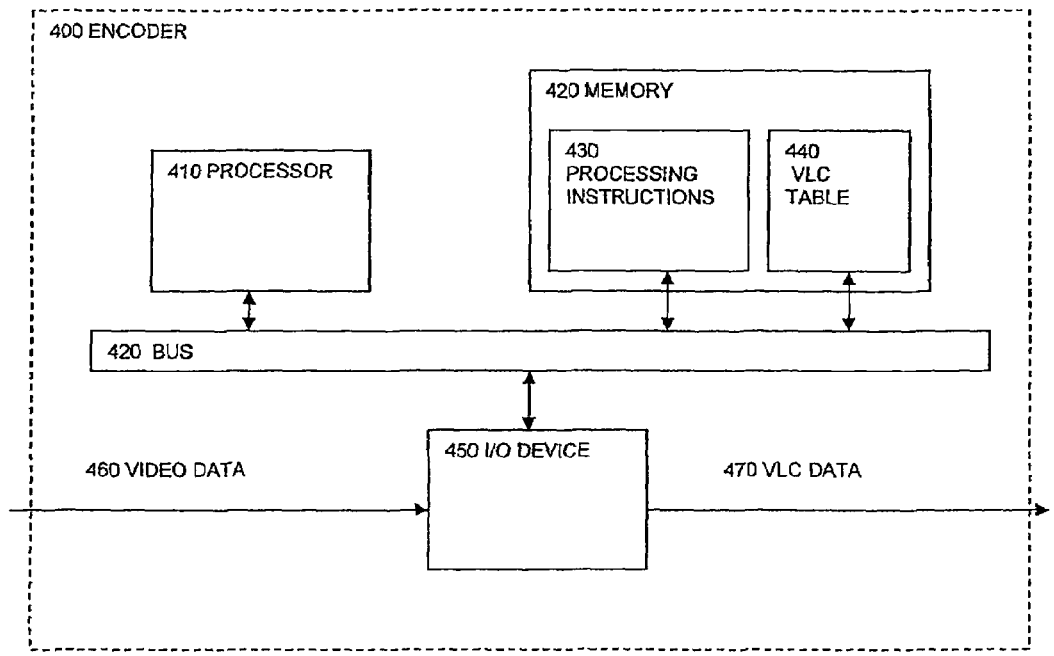
FIG. 4 is a schematic block diagram illustrating principles of an encoding device.

FIG. 4 is a schematic block diagram illustrating principles of an encoding device 400.

The encoding device 400 is a device for representing video data related to a macroblock of a video image in a coding procedure wherein certain video data or combinations of video data is represented in predefined events associated with indexed positions in a Variable Length Code (VLC) table including codes assigned to each indexed position. The encoding device 400 comprises an internal bus 420, interconnecting a processing device such as a microprocessor 410, an I/O device 450 and a memory 420. The memory 420 includes a portion 430 containing processing instructions and a portion 440 containing VLC table data.

The I/O device 450 includes an input device and an output device (not shown separately) which are both connected to the bus 420. Video data 460 is fed as input to the input device included in the I/O device 450, and is thus available for processing by the processing device 410. The output device included in the I/O device 450 is arranged to provide VLC data 470, generated by the processing device 410, as output.

The processing instructions held in the memory portion 430 are configured to cause the processing device 410 to perform a method for representing video data as described in the present specification, such as a method described with reference to FIG. 2.

Figure 5:
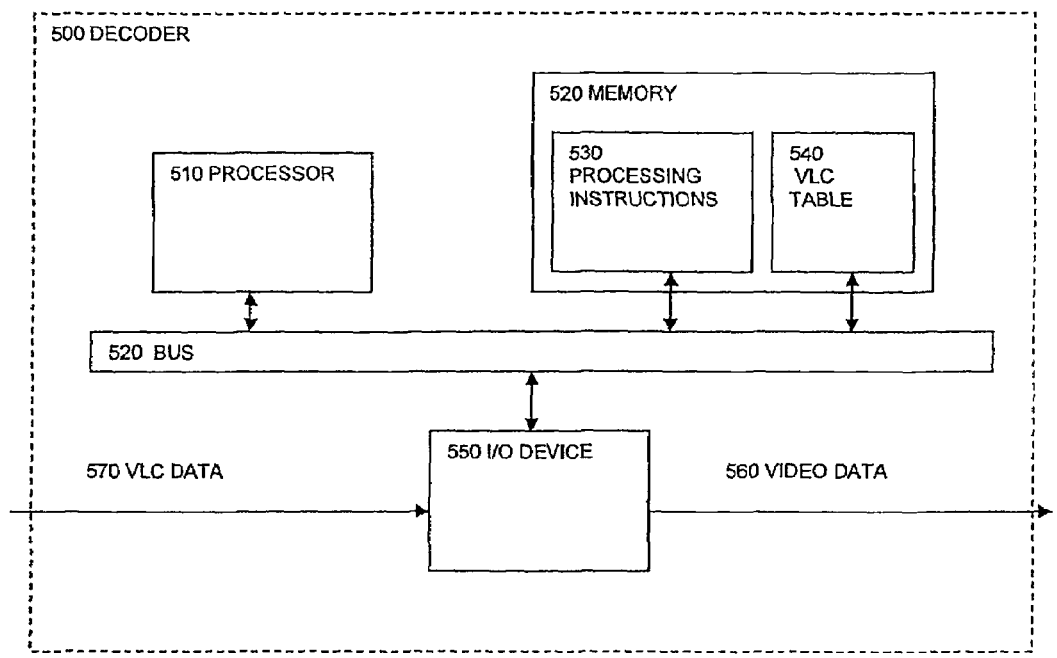
FIG. 5 is a schematic block diagram illustrating principles of a decoding device.

FIG. 5 is a schematic block diagram illustrating principles of a decoding device 500.

The decoding device 500 is a device for representing video data related to a macroblock of a video image in a coding procedure wherein certain video data or combinations of video data is represented in predefined events associated with indexed positions in a Variable Length Code (VLC) table including codes assigned to each indexed position.

The decoding device 500 comprises an internal bus 520, interconnecting a processing device such as a microprocessor 510, an I/O device 550 and a memory 520. The memory 520 includes a portion 530 containing processing instructions and a portion 540 containing VLC table data.

The I/O device 550 includes an input device and an output device (not shown separately) which are both connected to the bus 520.

VLC data 570 is fed as input to the input device included in the I/O device 550, and is thus available for processing by the processing device 510. The output device included in the I/O device 550 is arranged to provide video data 560, generated by the processing device 410, as output.

The processing instructions held in the memory portion 530 are configured to cause the processing device 510 to perform a method for interpreting codes as predefined events, as described in the present specification, such as a method described with reference to FIG. 3.

The exemplary embodiments of the present invention can be used with a variety of, or virtually all, VLC implementations. For example, when a part of a video sequence dominated by blue colors occurs, then the CBP events containing nonzero blue components would have relatively high probability whereas events containing nonzero red components would be low. When the color of the sequence has changed to red the probability of the events would have changed. The VLC table would according to the exemplary embodiments of present invention then gradually be rearranged due to the change of color.

The event tables for coding modes typically indicates inter prediction with 1, 2 or 4 motion vectors, intra prediction etc. With little motion in the picture from frame to frame, the inter mode with 1 motion vector may typically have the largest probability. Going to a part of the sequence with violent motion—or even scene change—intra mode may be the most probable mode.

As already indicated, the exemplary embodiments of the present invention use an adaptive reordering of events in an event table to dynamically obtain a closer match between the probability distribution of the events and the lengths of the VLC codes. The reordering is done dynamically and in the same way at the encoder and decoder so there is no need to signal any side information in relation to the reordering. The exact way of dynamically reordering could be done in several ways.

In one exemplary embodiment of the present invention, coding mode is considered. A mode in this context defines the way a MB (macroblock) is predicted and coded. A typical table may be:

| Event No. | Motion vectors/intra | Size | Nonzero coeffs |
|---|---|---|---|
| 0 | 1 | — | 0 |
| 1 | 1 | 16 × 16 | 1 |
| 2 | 1 | 8 × 8 | 1 |
| 3 | 2 | — | 0 |
| 4 | 2 | 8 × 8 | 1 |
| 5 | 4 | — | 0 |
| 6 | 4 | 8 × 8 | 1 |
| 7 | Intra | 8 × 8 | 1 |

In case of CBP, there is a 64 event table defining which of the 6 8×8 blocks in a MB has nonzero coefficients or not. The most frequent event may be varying, so a dynamic VLC according to the exemplary embodiments of the present invention could also be beneficial to use in the case of CBP.

Figure 1:
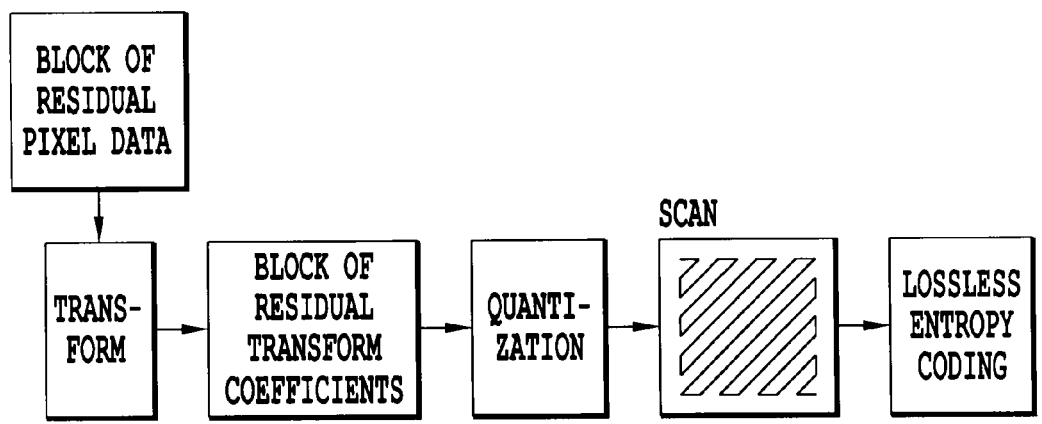
FIG. 1 is a block diagram showing the different processing steps in a conventional coding procedure.

Coding the last position is as earlier mentioned related to the coding of N×N transform coefficients. Statistically the low frequency coefficients are larger than the high frequency ones. This is reflected in the scanning of coefficients as depicted in the FIG. 1. It is therefore typical that many coefficients towards the end of the scan are equal to 0. Hence it may be useful to signal the position of the last nonzero coefficient in the scan. It is also advantageous to indicate whether the absolute value of this last nonzero coefficient is equal to 1 or >1. Therefore we end up with an event table with 2N2 events.

A way of dynamically adapting the ordering of the Mode event table above according to the present invention will now be described. Assuming that the process starts with the assumption that event_0 is the most probable, event_1 is second most probable etc. The order of the events that originally start with the table are:

0 1 2 3 4 5 6 7.

The position in the string indicates the number of the code to be used. Assume at the first instance event 2 is to be coded. Then code number 2 is used. At the same time, event_2 changes place with the event to the left in the string resulting in the new ordering to be used to code the next event:

0 2 1 3 4 5 6 7.

Event_2 occurs again and is this time coded with code number 1. Then, another re-ordering takes place with the following result:

2 0 1 3 4 5 6 7.

The next to be coded is event 4, which uses code number 4. After coding, event_4 is moved one position forward leading to the new event order:

2 0 1 4 3 5 6 7.

This process goes on and dynamically changes the ordering table to match the ordering of probability. If the reordering reflects only temporal conditions, the VLC will gradually convert back to the original ordering of the VLC. If the stable light and color conditions, do not match very well with the statistics from which the original ordering was derived, then the dynamic VLC will tend to convert to a different static order, more adjusted to the condition in question.

This dynamic reordering is not restricted to the mode table in the example, but can be used to any event table. The method of dynamic adaptation is also not limited to the simple method described above.

The methods and devices of the exemplary embodiments of the present invention do not require any exchange of data between encoder and decoder.

The exemplary methods and devices of the present invention result in more efficient coding/decoding of digital compressed video by dynamically reordering event tables to obtain a better match between event probabilities and VLC code words. This is particularly useful when coding video with light and color conditions temporarily or constant differing from the expected conditions from which static VLCs are derived.

Obviously, readily discernible modifications and variations of the present invention are possible in light of the above teachings. It is therefore to be understood that within the scope of the appended claims, the invention may be practiced otherwise than as specifically described herein. For example, while described in terms of both software and hardware components interactively cooperating, it is contemplated that the system described herein may be practiced entirely in software. The software may be embodied in a carrier such as magnetic or optical disk, or a radio frequency or audio frequency carrier wave.

As stated above, the devices in FIGS. 4 and 5 include at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes.

Furthermore, the processes descriptions or blocks in flow charts should be understood as representing modules, segments, portions of code which include one or more executable instructions for implementing specific logical functions or steps in the process, and alternate implementations are included within the scope of the exemplary embodiment of the present invention in which functions may be executed out of order from that shown or discussed, including substantially concurrently or in reverse order, depending upon the functionality involved, as would be understood by those skilled in the art. Furthermore, the processors shown in FIGS. 4 and 5 may execute code and perform steps indicated in FIGS. 2 and 3.

The invention claimed is:

1. A method for representing video data related to a macroblock of a video image in a coding procedure, said method comprising:

representing, with a processor, one or more of size of quantized transform coefficients, number of nonzero quantized transform coefficients in a block, position of a last nonzero quantized transform coefficients in a block, coding mode, or Coded Block Pattern with indexed positions in a Variable Length Code (VLC) table including codes assigned to each indexed position;

determining, with the processor, that a predetermined value of the one or more of size of quantized transform coefficients, number of nonzero quantized transform coefficients in a block, position of a last nonzero quantized transform coefficients in a block, coding mode, or Coded Block Pattern occurs in the video data during the coding procedure;

coding, with the processor, at least part of the video data with a code assigned to a position x in the VLC table associated with the predetermined value of the one or more of size of quantized transform coefficients, number of nonzero quantized transform coefficients in a block, position of a last nonzero quantized transform coefficients in a block, coding mode, or Coded Block Pattern that occurred in the video data during the coding procedure, the VLC table being stored in a memory device;

determining, with the processor, whether x>0, wherein 0 denotes a position at a top of the VLC table; and rearranging, with the processor, the VLC table by associating a different predetermined value of the one or more of size of quantized transform coefficients, number of nonzero quantized transform coefficients in a block, position of a last nonzero quantized transform coefficients in a block, coding mode, or Coded Block Pattern currently associated with a position x−1 with the position x, and associating the predetermined value of the one or more of size of quantized transform coefficients, number of nonzero quantized transform coefficients in a block, position of a last nonzero quantized transform coefficients in a block, coding mode, or Coded Block Pattern that occurred in the video data during the coding procedure with the position x−1.

2. A method for interpreting codes related to a macroblock of a video image in a decoding procedure, said method comprising:

representing, with a processor, one or more of size of quantized transform coefficients, number of nonzero quantized transform coefficients in a block, position of a last nonzero quantized transform coefficients in a block, coding mode, or Coded Block Pattern with indexed positions in a Variable Length Code (VLC) table including the codes assigned to each indexed position;

determining, with the processor, that a predetermined value of the one or more of size of quantized transform coefficients, number of nonzero quantized transform coefficients in a block, position of a last nonzero quantized transform coefficients in a block, coding mode, or Coded Block Pattern occurs in the video image during the decoding procedure;

decoding, with the processor, at least part of the video image with a code assigned to a position x in the VLC table associated with the predetermined value of the one or more of size of quantized transform coefficients, number of nonzero quantized transform coefficients in a block, position of a last nonzero quantized transform coefficients in a block, coding mode, or Coded Block Pattern that occurred in the video image during the decoding procedure, the VLC table being stored in a memory device;

determining, with the processor, whether x>0, wherein 0 denotes a position at a top of the VLC table; and rearranging, with the processor, the VLC table by associating a different predetermined value of the one or more of size of quantized transform coefficients, number of nonzero quantized transform coefficients in a block, position of a last nonzero quantized transform coefficients in a block, coding mode, or Coded Block Pattern currently associated with a position x−1 with position x, and associating the predetermined value of the one or more of size of quantized transform coefficients, number of nonzero quantized transform coefficients in a block, position of a last nonzero quantized transform coefficients in a block, coding mode, or Coded Block Pattern that occurred in the video image during the decoding procedure with the position x−1.

3. A device for representing video data related to a macroblock of a video image in a coding procedure, said device comprising:

a bus, interconnecting
an input device arranged to read said video data,
an output device arranged to provide variable length coding data,
a processing device, and
a memory, wherein thee memory stores processing instructions, which when executed by the processing device, cause the processing device to represent one or more of size of quantized transform coefficients, number of nonzero quantized transform coefficients in a block, position of a last nonzero quantized transform coefficients in a block, coding mode, or Coded Block Pattern with indexed positions in a Variable Length Code (VLC) table including codes assigned to each indexed position, determine that a predetermined value of the one or more of size of quantized transform coefficients, number of nonzero quantized transform coefficients in a block, position of a last nonzero quantized transform coefficients in a block, coding mode, or Coded Block Pattern occurs in the video data during the coding procedure, code at least part of the video data with a code assigned to a position x in the VLC table associated with the predetermined value of the one or more of size of quantized transform coefficients, number of nonzero quantized transform coefficients in a block, position of a last nonzero quantized transform coefficients in a block, coding mode, or Coded Block Pattern that occurred in the video data during the coding procedure, the VLC table being stored in a memory device, determine whether x>0, wherein 0 denotes a position at a top of the VLC table, and rearrange the VLC table by associating a different predetermined value of the one or more of size of quantized transform coefficients, number of nonzero quantized transform coefficients in a block, position of a last nonzero quantized transform coefficients in a block, coding mode, or Coded Block Pattern that occurred during the coding procedure currently associated with a position x−1 with the position x, and associating the predetermined value of the one or more of size of quantized transform coefficients, number of nonzero quantized transform coefficients in a block, position of a last nonzero quantized transform coefficients in a block, coding mode, or Coded Block Pattern that occurred in the video data during the coding procedure with the position x−1.

4. A device for interpreting codes related to a macroblock of a video image in a decoding procedure, said device comprising:
   a bus, interconnecting
   an input device configured to read video data,
   an output device configured to provide variable length coding data,
   a processing device, and
   a memory,
   wherein the memory stores processing instructions, which when executed by the processing device, cause the processing device to
   representing one or more of size of quantized transform coefficients, number of nonzero quantized transform coefficients in a block, position of a last nonzero quantized transform coefficients in a block, coding mode, or Coded Block Pattern associated with indexed positions in a Variable Length Code (VLC) table including the codes assigned to each indexed position,
   determine that a predetermined value of the one or more of size of quantized transform coefficients, number of nonzero quantized transform coefficients in a block, position of a last nonzero quantized transform coefficients in a block, coding mode, or Coded Block Pattern occurs in the video image during the decoding procedure,
   decode at least part of the video image with a code assigned to a position x in the VLC table associated with the predetermined value of the one or more of size of quantized transform coefficients, number of nonzero quantized transform coefficients in a block, position of a last nonzero quantized transform coefficients in a block, coding mode, or Coded Block Pattern that occurred in the video image during the decoding procedure, the VLC table being stored in a memory device,
   determine whether x>0, wherein 0 denotes a position at a top of the VLC table, and
   rearrange the VLC table by associating a different predetermined value of the one or more of size of quantized transform coefficients, number of nonzero quantized transform coefficients in a block, position of a last nonzero quantized transform coefficients in a block, coding mode, or Coded Block Pattern currently associated with a position x−1 with position x, and associating the predetermined value of the one or more of size of quantized transform coefficients, number of nonzero quantized transform coefficients in a block, position of a last nonzero quantized transform coefficients in a block, coding mode, or Coded Block Pattern that occurred in the video image during the decoding procedure with the position x−1.

5. A non-transitory computer readable storage medium encoded with instructions, which when executed by a processor, causes the processor to implement a method for representing video data related to a macroblock of a video image in a coding procedure the method comprising:
   representing, with a processor, one or more of size of quantized transform coefficients, number of nonzero quantized transform coefficients in a block, position of a last nonzero quantized transform coefficients in a block, coding mode, or Coded Block Pattern with indexed positions in a Variable Length Code (VLC) table including codes assigned to each indexed position;
   determining, with the processor, that a predetermined value of the one or more of size of quantized transform coefficients, number of nonzero quantized transform coefficients in a block, position of a last nonzero quantized transform coefficients in a block, coding mode, or Coded Block Pattern occurs in the video data during the coding procedure;
   coding, with the processor, at least part of the video data with a code assigned to a position x in the VLC table associated with the predetermined value of the one or more of size of quantized transform coefficients, number of nonzero quantized transform coefficients in a block, position of a last nonzero quantized transform coefficients in a block, coding mode, or Coded Block Pattern that occurred in the video data during the coding procedure, the VLC table being stored in a memory device;
   determining, with the processor, whether x>0, wherein 0 denotes a position at a top of the VLC table; and
   rearranging, with the processor, the VLC table by associating a different predetermined value of the one or more of size of quantized transform coefficients, number of nonzero quantized transform coefficients in a block, position of a last nonzero quantized transform coefficients in a block, coding mode, or Coded Block Pattern currently associated with a position x−1 with the position x, and associating the predetermined value of the one or more of size of quantized transform coefficients, number of nonzero quantized transform coefficients in a block, position of a last nonzero quantized transform coefficients in a block, coding mode, or Coded Block Pattern that occurred in the video data during the coding procedure with the position x−1.

6. A non-transitory computer readable storage medium encoded with instructions, which when executed by a processor, causes the processor to implement a method for interpreting codes related to a macroblock of a video image in a decoding procedure, the method comprising:
   representing, with a processor, one or more of size of quantized transform coefficients, number of nonzero quantized transform coefficients in a block, position of a last nonzero quantized transform coefficients in a block, coding mode, or Coded Block Pattern with indexed positions in a Variable Length Code (VLC) table including the codes assigned to each indexed position;
   determining, with the processor, that a predetermined value of the one or more of size of quantized transform coefficients, number of nonzero quantized transform coefficients in a block, position of a last nonzero quantized transform coefficients in a block, coding mode, or Coded Block Pattern occurs in the video image during the decoding procedure;
   decoding, with the processor, at least part of the video image with a code assigned to a position x in the VLC table associated with the predetermined value of the one or more of size of quantized transform coefficients, number of nonzero quantized transform coefficients in a block, position of a last nonzero quantized transform coefficients in a block, coding mode, or Coded Block Pattern that occurred in the video image during the decoding procedure, the VLC table being stored in a memory device;
   determining, with the processor, whether x>0, wherein 0 denotes a position at a top of the VLC table; and
   rearranging, with the processor, the VLC table by associating a different predetermined value of the one or more of size of quantized transform coefficients, number of nonzero quantized transform coefficients in a block, position of a last nonzero quantized transform coefficients in a block, coding mode, or Coded Block Pattern currently associated with a position x−1 with position x, and associating the predetermined value of the one or more of size of quantized transform coefficients, number of nonzero quantized transform coefficients in a block, position of a last nonzero quantized transform coefficients in a block, coding mode, or Coded Block Pattern that occurred in the video image during the decoding procedure with the position x−1.

* * * * *